(12) United States Patent
Huang et al.

(10) Patent No.: US 7,893,547 B2
(45) Date of Patent: Feb. 22, 2011

(54) SEMICONDUCTOR PACKAGE WITH A SUPPORT STRUCTURE AND FABRICATION METHOD THEREOF

(75) Inventors: Chien-Ping Huang, Taichung (TW); Fu-Di Tang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 11/164,322

(22) Filed: Nov. 18, 2005

(65) Prior Publication Data
US 2007/0059865 A1   Mar. 15, 2007

(30) Foreign Application Priority Data
Dec. 22, 2004   (TW) .............................. 93139956 A (51) Int. Cl.
*H01L 23/28* (2006.01)
(52) U.S. Cl. .................. 257/787; 257/678; 257/730; 257/E23.116; 257/E23.123; 257/E23.124
(58) Field of Classification Search ................ 257/690, 257/692, 787, E23.116, E23.123, E23.124, 257/E23.125, E23.128
See application file for complete search history.

(56) References Cited

U.S. PATENT DOCUMENTS

| 5,830,800 | A | 11/1998 | Lin | 438/459 |
|---|---|---|---|---|
| 6,541,848 | B2 * | 4/2003 | Kawahara et al. | 257/690 |
| 6,933,594 | B2 * | 8/2005 | McLellan et al. | 257/676 |
| 6,964,918 | B1 * | 11/2005 | Fan et al. | 438/614 |
| 2003/0209785 | A1 * | 11/2003 | Choi et al. | 257/666 |

* cited by examiner

*Primary Examiner*—Angel Roman (57) ABSTRACT

A semiconductor package with a support structure and a fabrication method thereof are provided. With a chip being electrically connected to electrical contacts formed on a carrier, a molding process is performed. A plurality of recessed portions formed on the carrier are filled with an encapsulant for encapsulating the chip during the molding process. After the carrier is removed, the part of the encapsulant filling the recessed portions forms outwardly protruded portions on a surface of the encapsulant, such that the semiconductor package can be attached to an external device via the protruded portions.

4 Claims, 9 Drawing Sheets

SEMICONDUCTOR PACKAGE WITH A SUPPORT STRUCTURE AND FABRICATION METHOD THEREOF

FIELD OF THE INVENTION

The present invention relates to semiconductor packages and fabrication methods thereof, and more particularly, to a semiconductor package with a support structure and a fabrication method of the semiconductor package.

BACKGROUND OF THE INVENTION

A lead frame is usually used as a chip carrier for mounting a semiconductor chip thereon to form a semiconductor package. The lead frame comprises a die pad and a plurality of leads around the die pad. After the semiconductor chip is attached to the die pad and is electrically connected to the leads by bonding wires, an encapsulant is formed to encapsulate the chip, the die pad, the bonding wires and inner portions of the leads, thereby completing the semiconductor package.

Various types of lead-frame-based semiconductor packages have been developed such as QFP (Quad Flat Package), QFN (Quad Flat Non-leaded) package, SOP (Small Outline Package), DIP (Dual in-line Package) and so on. In order to improve the heat dissipating efficiency and reduce the size of the semiconductor package, the QFN package with an exposed die pad is mostly favorable at present.

Figure 1:
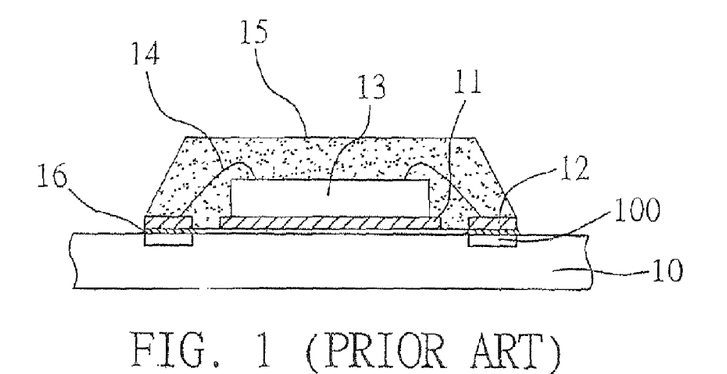
FIG. 1 (PRIOR ART) is a cross-sectional view showing a conventional QFN semiconductor package mounted on a printed circuit board.

The QFN package is characterized in not having outer leads, unlike the QFP using the outer leads for electrically connecting an external device, such that the size of the QFN package can be reduced. As shown in FIG. 1 (PRIOR ART), bottom surfaces of a die pad 11 and leads 12 of a lead frame in the QFN package 1 are all exposed from an encapsulant 15, such that heat produced by a semiconductor chip 13, which is mounted on the die pad 11 and is electrically connected to the leads 12 via bonding wires 14, can be effectively dissipated out of the QFN package 1. The exposed surfaces of the leads 12 can be bonded to bond pads 100 of an external device such as a printed circuit board 10 via solder joints 16 to electrically connect the QFN package 1 to the printed circuit board 10.

However, the thickness of the lead-frame-based semiconductor package cannot be further reduced as having to count the thickness of the lead frame. Since profile miniaturization of a semiconductor product becomes more and more important, there is developed a semiconductor package without a chip carrier (customarily referred to as carrier-free semiconductor package), which desirably makes the thickness thereof smaller than the thickness of the lead-frame-based package.

Figure 2:
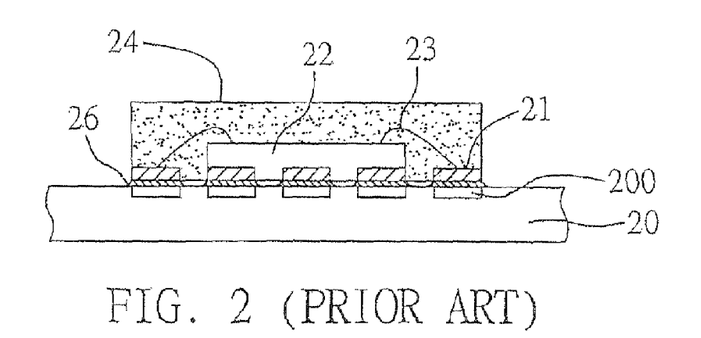
FIG. 2 (PRIOR ART) is a cross-sectional view showing a carrier-free semiconductor package mounted on a printed circuit board as disclosed in U.S. Pat. No. 5,830,800.

FIG. 2 (PRIOR ART) shows a carrier-free semiconductor package disclosed in U.S. Pat. No. 5,830,800. In the semiconductor package, a plurality of plated pads 21 are formed on a copper carrier (not shown) according to a predetermined circuit layout. Each of the plated pads 21 comprises Au/Pd/Ni/Pd layers and has a thickness of about 6 μm. Next, a chip 22 is mounted on the copper carrier and connected with bonding wires 23, and an encapsulant 24 is formed by a molding process. Then, the copper carrier is removed and the plated pads 21 are exposed. The carrier-free semiconductor package is thus completed, and can be electrically connected to an external device such as a printed circuit board 20 by bonding the exposed plated pads 21 to bond pads 200 of the printed circuit board 20 via solder joints 26.

Figure 3:
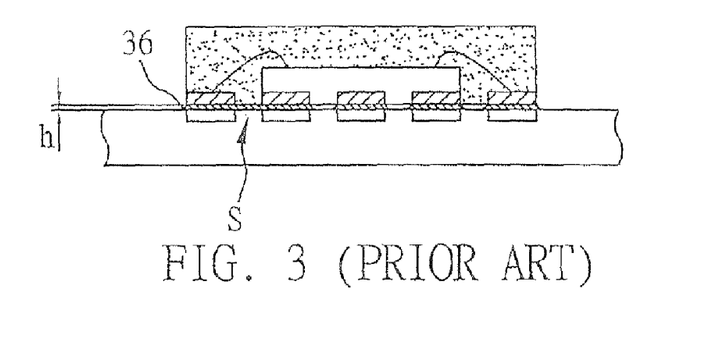
FIG. 3 (PRIOR ART) is a cross-sectional view showing short circuit caused by mutual contact between adjacent solder joints when a conventional package is electrically connected to an external device.

Referring to FIG. 3 (PRIOR ART), however, as the QFN package or the carrier-free semiconductor package is directly attached to and abuts against the printed circuit board via solder joints 36 and by Surface Mount Technology (SMT), when forming the solder joints 36 by reflowing a solder material, if the amount of solder material or an attachment distance between the package and the printed circuit board is not precisely controlled, the adjacent solder joints may easily come into contact with each other and cause short circuit S, as shown in FIG. 3 (PRIOR ART).

During the fabrication processes, thermal stress may be produced between the package and the printed circuit board due to mismatch in Coefficient of Thermal Expansion (CTE) between materials of the package and the printed circuit board. The thermal stress is directly proportional to the CTE mismatch and is inversely proportional to the height of the solder joints. As the foregoing package is bonded to the printed circuit board by SMT and through the solder joints only, due to the CTE mismatch between the package and the printed circuit board, significant thermal stress is exerted to the solder joints. Such thermal stress is directly proportional to $((\alpha_2-\alpha_1)/\Delta T \cdot \delta_1)/h$, wherein $(\alpha_2-\alpha_1)$ represents the CTE difference between the package and the printed circuit board, $\Delta T$ represents the largest temperature difference between the package and the printed circuit board, $\delta_1$ represents the distance from the center of the package to the farthest solder joint, and h represents the height of the solder joints. In the foregoing package, the solder joints 36 as having an extremely low height h between the package and the printed circuit board would suffer very high thermal stress, which not only reduces the fatigue life of the solder joints 36 but also leads to cracking of the solder joints 36, thereby severely degrading reliability of the electronic product. On the other hand, if increasing the amount of solder material and the height of the solder joints, the adjacent solder joints may easily come into contact with each other and cause short circuit in the case using an excess amount of the solder material or failing to precisely control the attachment distance between the package and the printed circuit board.

Therefore, the problem to be solved here is to provide a semiconductor package and a fabrication method thereof, which can eliminate the above drawbacks in the prior art.

SUMMARY OF THE INVENTION

In light of the foregoing drawbacks in the prior art, an objective of the present invention is to provide a semiconductor package with a support structure and a fabrication method thereof, which can avoid short circuit between solder materials applied on adjacent electrical contacts caused by an excess amount of solder material being used or failing to precisely control an attachment distance between the semiconductor package and an external device.

Another objective of the present invention is to provide a semiconductor package with a support structure and a fabrication method thereof, which can eliminate solder joint cracks caused by an excessively low height of solder material between the semiconductor package and an external device.

In accordance with the above and other objectives, the present invention proposes a semiconductor package with a support structure, comprising: a plurality of electrical contacts; at least one chip electrically connected to the electrical contacts; and an encapsulant for encapsulating the chip and the electrical contacts, wherein at least one surface of each of the electrical contacts is exposed from the encapsulant, and outwardly protruded portions are formed on a surface of the encapsulant such that the semiconductor package can be attached to an external device via the protruded portions. The semiconductor package may not have a chip carrier or may contain a lead frame. The chip can be electrically connected to the electrical contacts by a flip-chip method or a wire-bonding method. The protruded portions of the encapsulant are formed in the semiconductor package at positions not having the electrical contacts and the chip. For example, the protruded portions may be formed between the electrical contacts and the chip or at corners of the semiconductor package. The protruded portions have a flexible shape such as a dot shape, strip shape or circular shape, to allow the semiconductor package to be effectively connected to the external device via the protruded portions.

The present invention also proposes a fabrication method of the semiconductor package according to a preferred embodiment, which comprises the steps of: preparing a carrier formed with a plurality of electrical contacts and recessed portions thereon; mounting at least one chip on the carrier and electrically connecting the chip to the electrical contacts; performing a molding process to form an encapsulant on the carrier for encapsulating the chip and the electrical contacts and filling the recessed portions of the carrier; and removing the carrier such that the electrical contacts are exposed from the encapsulant and the part of the encapsulant filling the recessed portions forms outwardly protruded portions on a surface of the encapsulant. The fabrication processes of the semiconductor package can be carried out with a single package method or a batch type method.

The fabrication method of the semiconductor package according to another preferred embodiment of the present invention comprises the steps of: preparing a lead frame having a die pad and a plurality of leads formed around the die pad, and mounting at least one chip on the die pad and electrically connecting the chip to the leads via bonding wires; placing the lead frame mounted with the chip in a mold to perform a molding process, the mold including an upper mold and a lower mold, wherein a mold cavity is formed between the upper mold and the lower mold for receiving the lead frame therein, and a surface of the lower mold is formed with recessed portions, such that an encapsulant is injected into the mold cavity to encapsulate the chip and the bonding wires and fill the recessed portions of the lower mold; and removing the mold such that bottom surfaces of the die pad and the leads are exposed from the encapsulant and the part of the encapsulant filling the recessed portions forms outwardly protruded portions on a surface of the encapsulant. The fabrication processes of the semiconductor package can be carried out with a single package method or a batch type method.

Therefore, according to the semiconductor package with a support structure and the fabrication method thereof in the present invention, after the chip is electrically connected to the electrical contacts of the semiconductor package, the molding process is performed and the recessed portions formed on the carrier are filled with the encapsulant for encapsulating the chip when the encapsulant is injected. As a result, when the carrier is removed, the part of the encapsulant filling the recessed portions forms the protruded portions on the surface of the encapsulant, such that the semiconductor package can be attached to an external device via the protruded portions. Thereby, unlike the prior art, the present invention avoids a short circuit problem resulted from mutual contact between solder materials applied on the adjacent electrical contacts if an attachment distance between the semiconductor package and the external device or an amount of the solder materials being used is not precisely controlled when the semiconductor package is directly attached to and abuts against the external device as in the prior art. Moreover in the present invention, the protruded portions of the encapsulant have a supporting height to support the semiconductor package, such that excessively high thermal stress and solder joint cracks caused by an excessively low height of solder material between the semiconductor package and the external device can be eliminated.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of a semiconductor package with a support structure and a fabrication method thereof proposed in the present invention are described as follows with reference to FIGS. 4 to 10.

FIGS. 4A to 4G are cross-sectional views showing steps of the fabrication method of a semiconductor package with a support structure according to a preferred embodiment of the present invention. It should be noted that the drawings are schematic diagrams showing the basic components relating to the present invention, and the present invention is not particularly limited to the type, number, shape and size of the components shown in the drawings, that is, the arrangement of components may be more complicated in practical implementation.

Figure 4A:
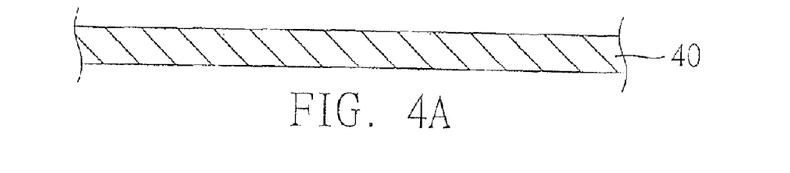
FIGS. 4A to 4G are cross-sectional views showing steps of a fabrication method of a semiconductor package with a support structure according to a preferred embodiment of the present invention.

As shown in FIG. 4A, firstly, a carrier 40 is prepared, which is made of a metal material such as copper and serves as a conductive path for a plating current used in a subsequent electroplating process.

Figure 4B:
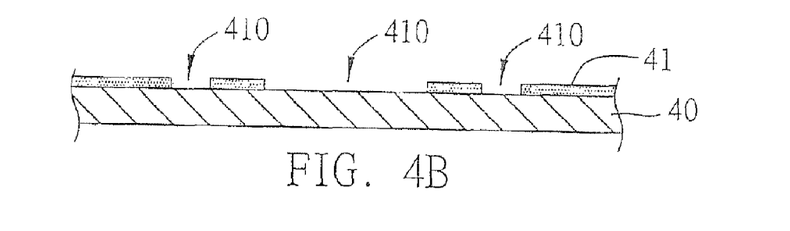

Next, as shown in FIG. 4B, a resist layer 41 is applied on a surface of the carrier 40 and is formed with a plurality of openings 410 by a patterning process, such that a part of the carrier 40 is exposed via the openings 410. The resist layer 41 can be a photoresist layer, and the patterning process includes exposure, development and so on to form the openings 410 in the resist layer 41.

Figure 4C:
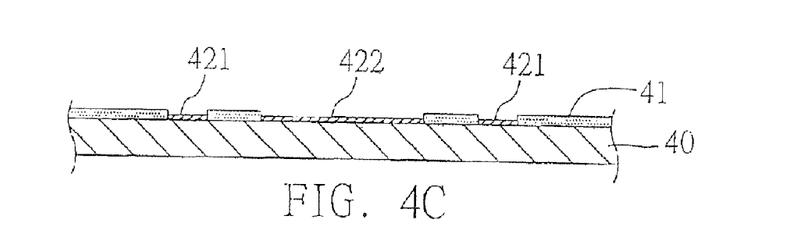

As shown in FIG. 4C, the electroplating process is carried out, using the metal carrier 40 to conduct the plating current, such that a plurality of electrical contacts 421 and a die pad 422 are formed on the part of the carrier 40 exposed via the openings 410 of the resist layer 41 according to a predetermined circuit layout. The electrical contacts 421 are thin plated pads comprising such as Au/Pd/Ni/Pd layers, thereby favorable for profile miniaturization of the semiconductor package.

Figure 4D:
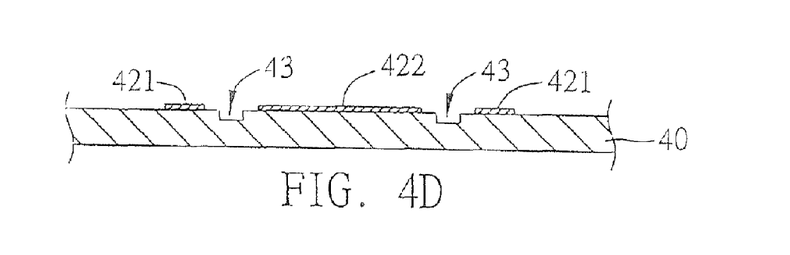

As shown in FIG. 4D, the resist layer 41 is removed, and the surface of the carrier 40 is formed with recessed portions 43, wherein the recessed portions 43 are located on the carrier 40 at positions not having the electrical contacts 421 and the die pad 422. The recessed portions 43 may have a shape such as a dot shape, strip shape, or circular shape, etc.

Figure 4E:
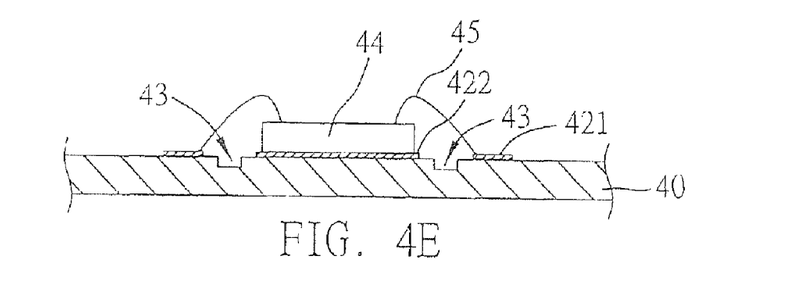

As shown in FIG. 4E, a chip 44 is mounted on the die pad 422, and a wire-bonding process is carried out to electrically connect the chip 44 to the plurality of electrical contacts 421 disposed around the chip 44 through a plurality of bonding wires 45.

Figure 4F:
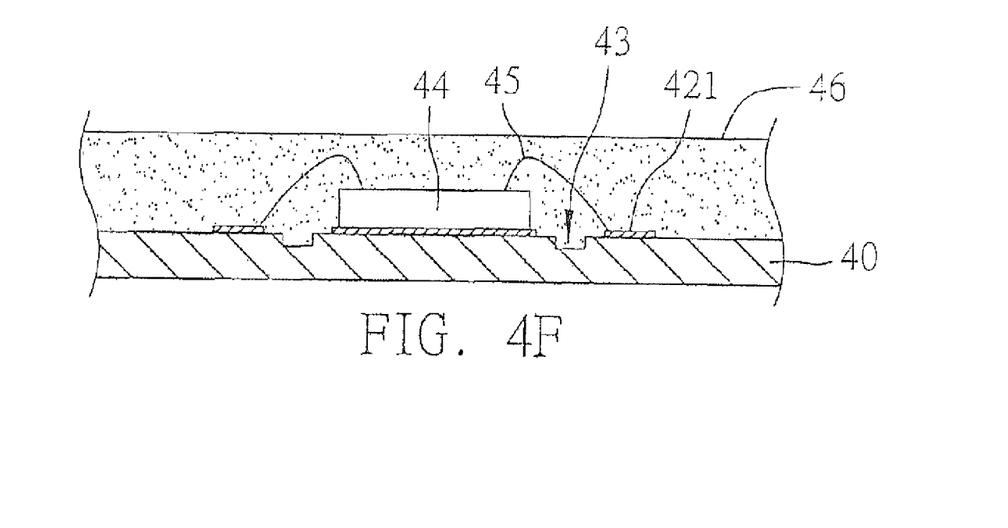

As shown in FIG. 4F, a molding process is carried out, such that an encapsulant 46 is formed on the carrier 40 to encapsulate the chip 44, the bonding wires 45 and the electrical contacts 421, so as to protect the chip 44 and the bonding wires 45 from external damage. The encapsulant 46 can be made of a resin material to allow the encapsulant 46 to fill the recessed portions 43 formed on the surface of the carrier 40.

Figure 4G:
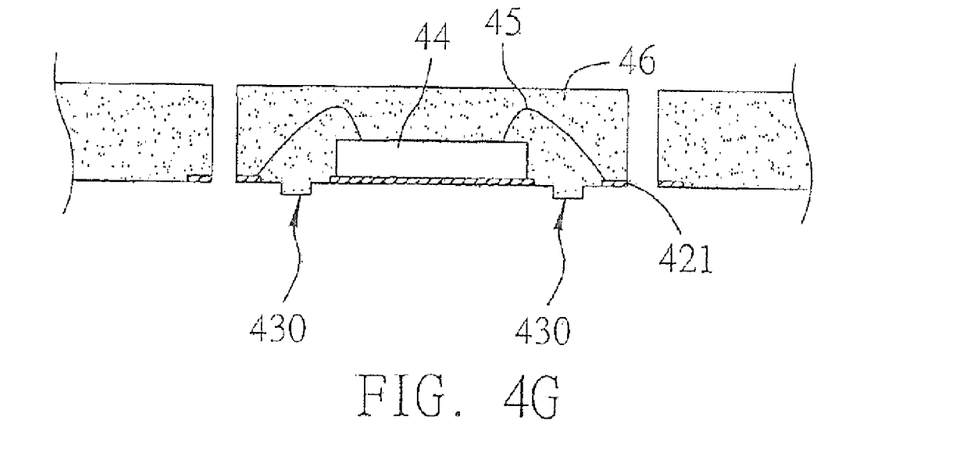

As shown in FIG. 4G, the carrier 40 is removed by for example an etching process, such that the electrical contacts 421 are exposed from the encapsulant 46 and can be electrically connected to an external device. After the carrier 40 is removed, the part of the encapsulant 46 filling the recessed portions 43 forms outwardly protruded portions 430 on a surface of the encapsulant 46. A singulation process may then be carried out to cut the encapsulant 46 along a predetermined cutting path to thereby form the required semiconductor package.

Therefore, according to the present invention, the outwardly protruded portions are formed on the surface of the encapsulant, allowing the semiconductor package to be attached to an external device by the protruded portions. This arrangement can avoid a short circuit problem resulted from mutual contact between solder materials applied on the adjacent electrical contacts of the semiconductor package if an attachment distance between the semiconductor package and the external device is not precisely controlled or an excess amount of the solder materials is used. As the protruded portions have a supporting height to support the semiconductor package, excessively high thermal stress and solder joint cracks caused by an excessively low height of solder material between the semiconductor package and the external device can be eliminated.

Alternatively, a plurality of solder bumps may be formed as bump leads on the carrier in place of the patterned plated pads, and similarly, the chip is electrically connected to the corresponding bump leads via the bonding wires, to thereby attain the same effect. Moreover, apart from mounting the chip on the die pad of the carrier, the chip may alternatively be directly attached to a predetermined portion on the carrier if no die pad is provided, and the portion of the carrier is used as a temporary chip carrier and is removed after the molding process. Further, the fabrication processes of the semiconductor package according to the present invention can be performed with a single package method or a batch type method that is for massively producing the required semiconductor packages.

FIGS. 5A to 5D are cross-sectional views showing steps of the fabrication method of a semiconductor package with a support structure according to another preferred embodiment of the present invention. The fabrication method in the present embodiment is similar to that in the foregoing embodiment, with the primary difference in that the recessed portions on the surface of the carrier are formed before the electroplating process in the present embodiment.

Figure 5A:
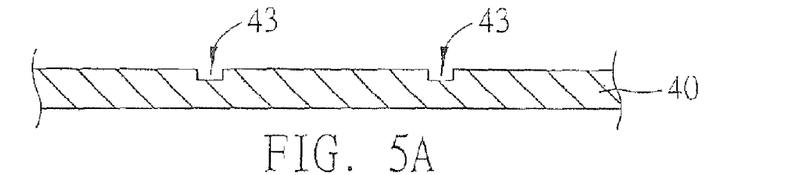
FIGS. 5A to 5D are cross-sectional views showing steps of a fabrication method of a semiconductor package with a support structure according to another preferred embodiment of the present invention.

Firstly, as shown in FIG. 5A, a metal carrier 40 is prepared, wherein a plurality of recessed portions 43 are formed on a surface of the carrier 40 at positions not interfering with a circuit layout of the carrier 40.

Figure 5B:
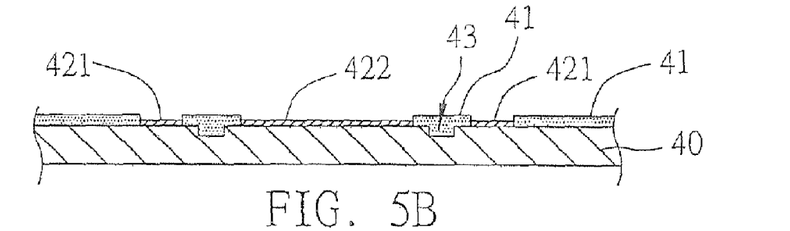

Next, as shown in FIG. 5B, a resist layer 41 is applied on the surface of the carrier 40 and covers the recessed portions 43. A plurality of openings are formed in the resist layer 41 by a patterning process to expose a part of the carrier 40. Then, an electroplating process is carried out, using the metal carrier 40 to conduct a plating current, such that a plurality of electrical contacts 421 and a die pad 422 are formed on the part of the carrier 40 exposed via the openings of the resist layer 41 according to a predetermined circuit layout.

Figure 5C:
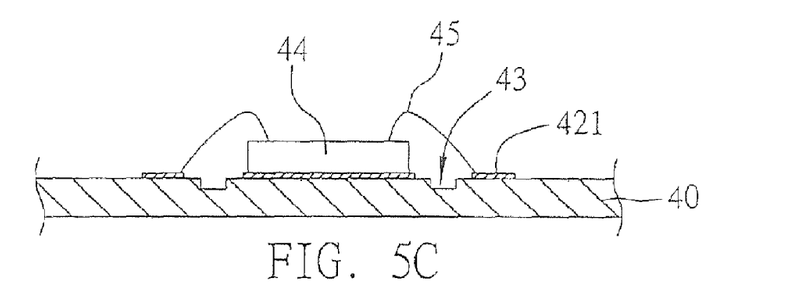

As shown in FIG. 5C, the resist layer 41 is removed. A chip 44 is mounted on the die pad 422, and a wire-bonding process is carried out to electrically connect the chip 44 to the plurality of electrical contacts 421 disposed around the chip 44 through a plurality of bonding wires 45.

Figure 5D:
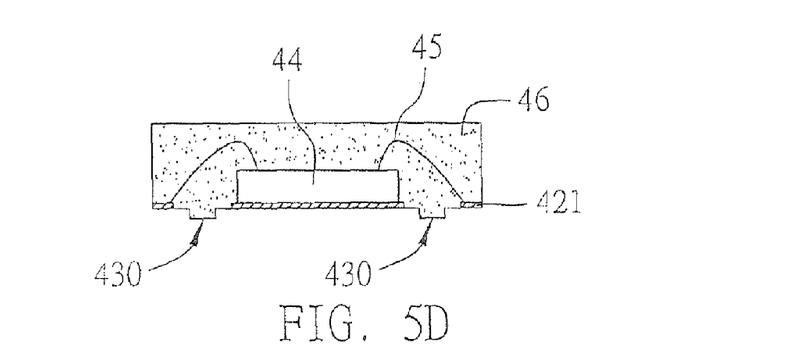

As shown in FIG. 5D, a molding process is carried out, such that an encapsulant 46 is formed on the carrier 40 to encapsulate the chip 44, the bonding wires 45 and the electrical contacts 421 and fill the recessed portions 43 formed on the surface of the carrier 40. Then, the carrier 40 is removed, such that the electrical contacts 421 are exposed from the encapsulant 46, and the part of the encapsulant 46 filling the recessed portions 43 forms outwardly protruded portions 430 on a surface of the encapsulant 46, followed by a singulation process to cut the encapsulant 46 along a predetermined cutting path to thereby form the required semiconductor package.

Figure 6A:
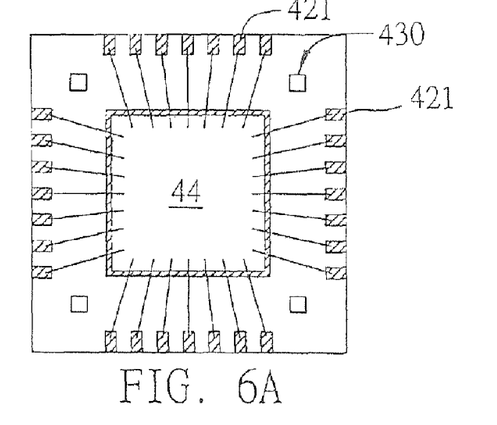
FIGS. 6A to 6C are planar views showing various examples of protruded portions in the semiconductor package according to the present invention.
Figure 6B:
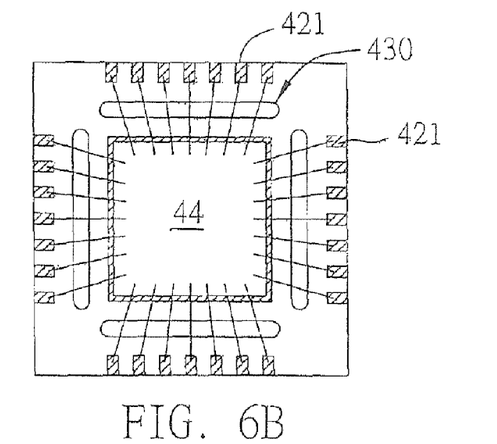
Figure 6C:
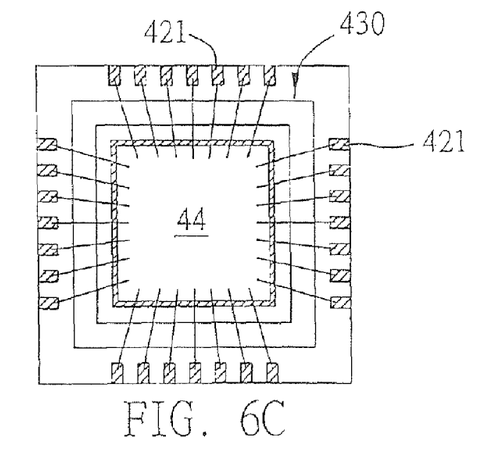

FIGS. 6A to 6C are planar views showing various examples of protruded portions in the semiconductor package according to the present invention. As shown in the drawings, the protruded portions 430 can be formed in the semiconductor package at positions not interfering with the electrical contacts 421 and the chip 44. The protruded portions 430 may have a shape such as a dot shape (as shown in FIG. 6A), strip shape (as shown in FIG. 6B), or circular shape (as shown in FIG. 6C), etc. The number and location of the protruded portions 430 are flexibly arranged according to practical design requirements to allow the semiconductor package to be effectively connected to an external device via the protruded portions 430.

Figure 7:
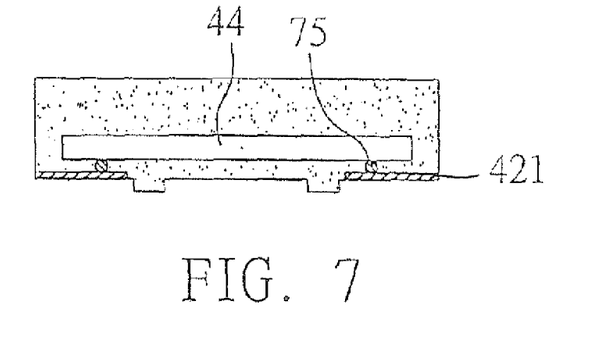
FIG. 7 is a cross-sectional view showing a semiconductor package with a support structure according to another preferred embodiment of the present invention.

FIG. 7 is a cross-sectional view of the semiconductor package according to another preferred embodiment of the present invention. Apart from using the bonding wires for electrically connecting the chip to the electrical contacts as described in the foregoing embodiment, the semiconductor chip 44 may alternatively be electrically connected to the electrical contacts 421 by a flip-chip method using a plurality of metal bumps 75, as shown in FIG. 7.

Figure 8:
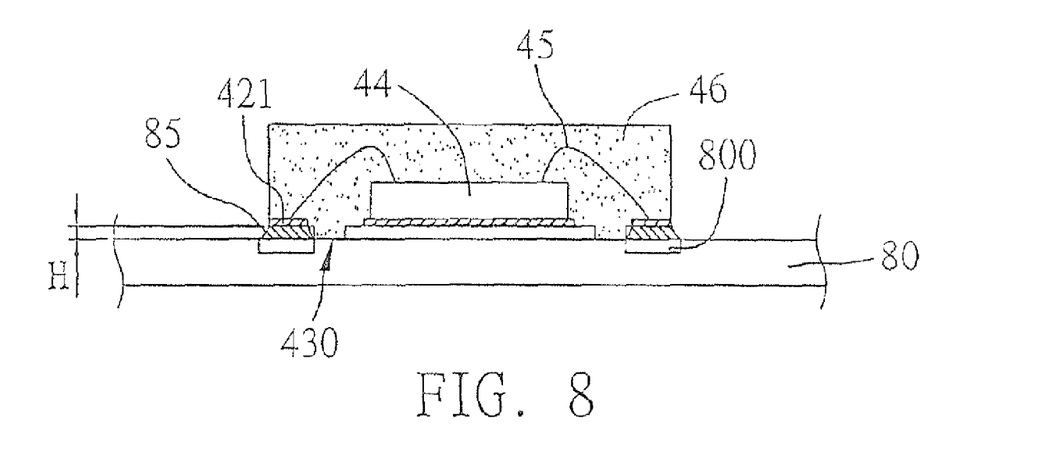
FIG. 8 is a cross-sectional view showing the semiconductor package according to the present invention attached to a printed circuit board.

Accordingly, the semiconductor package produced by the fabrication method according to the present invention comprises: the chip 44 and the plurality of electrical contacts 421, wherein the chip 44 is electrically connected to the electrical contacts 421 by the bonding wires 45 or the metal bumps 75; the encapsulant 46 for encapsulating the chip 44, the bonding wires 45 (or the metal bumps 75) and the electrical contacts 421, wherein the electrical contacts 421 are exposed from the encapsulant 46, and the outwardly protruded portions 430 are formed on the surface of the encapsulant 46, such that the semiconductor package can be attached to an external device by the protruded portions 430. As shown in FIG. 8, the semiconductor package is electrically connected to the external device such as a printed circuit board 80 by bonding the electrical contacts 421 to bond pads 800 of the printed circuit board 80 via solder materials 85 through the use of SMT (Surface Mount Technology). This arrangement can avoid a short circuit problem resulted from mutual contact between the solder materials on the adjacent electrical contacts of the semiconductor package if an attachment distance between the semiconductor package and the external device is not precisely controlled or an excess amount of the solder materials is used. Moreover, with the protruded portions 430 having a supporting height H to support the semiconductor package, excessively high thermal stress and solder joint cracks caused by an excessively low height of solder material between the semiconductor package and the external device can be eliminated.

Figure 9A:
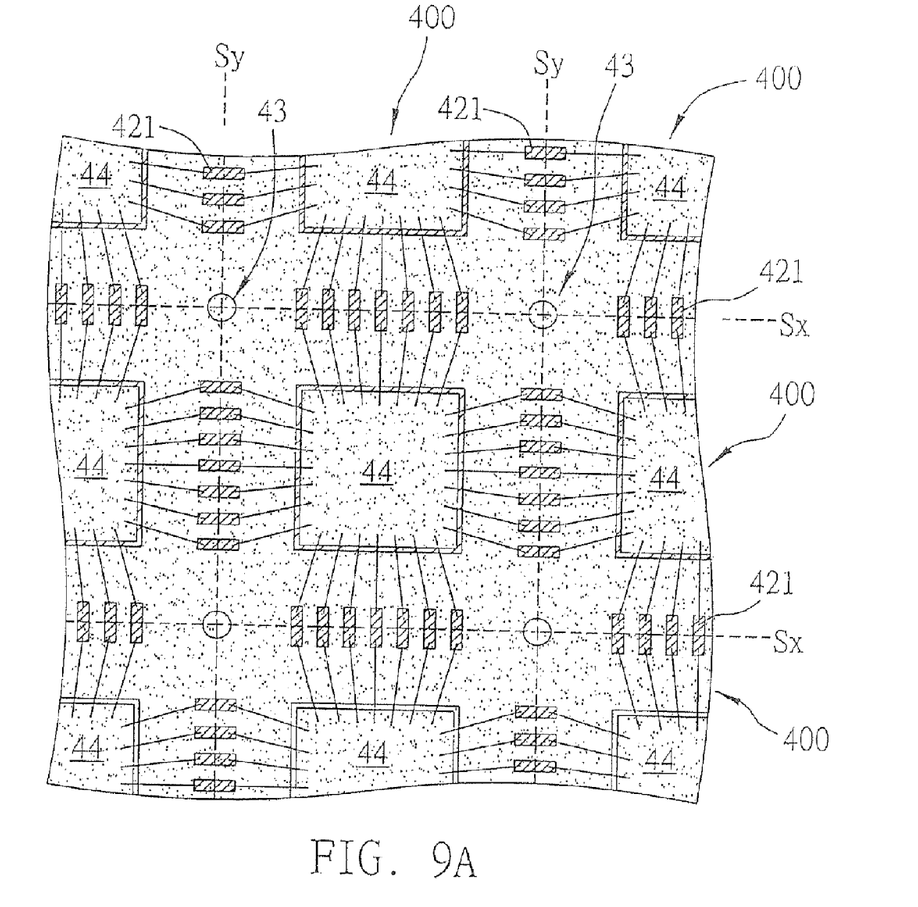
FIGS. 9A to 9D are schematic diagrams showing steps of a batch type method for fabricating semiconductor packages according to the present invention.
Figure 9B:
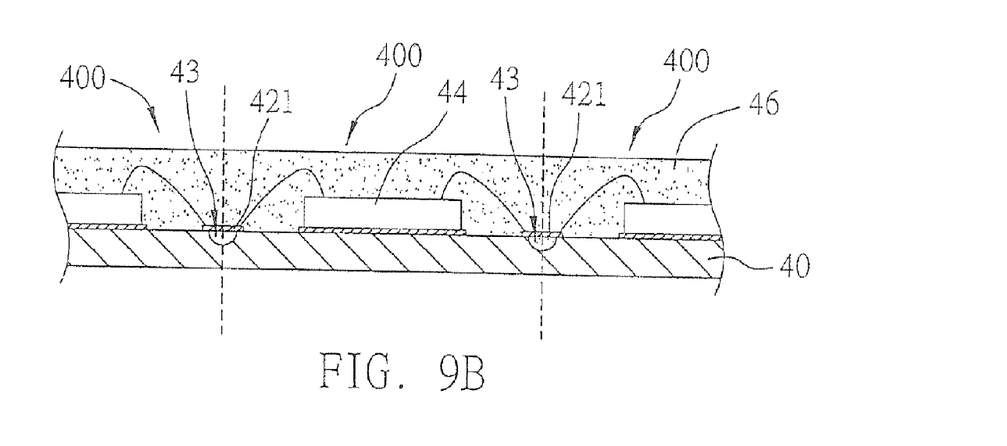
Figure 9C:
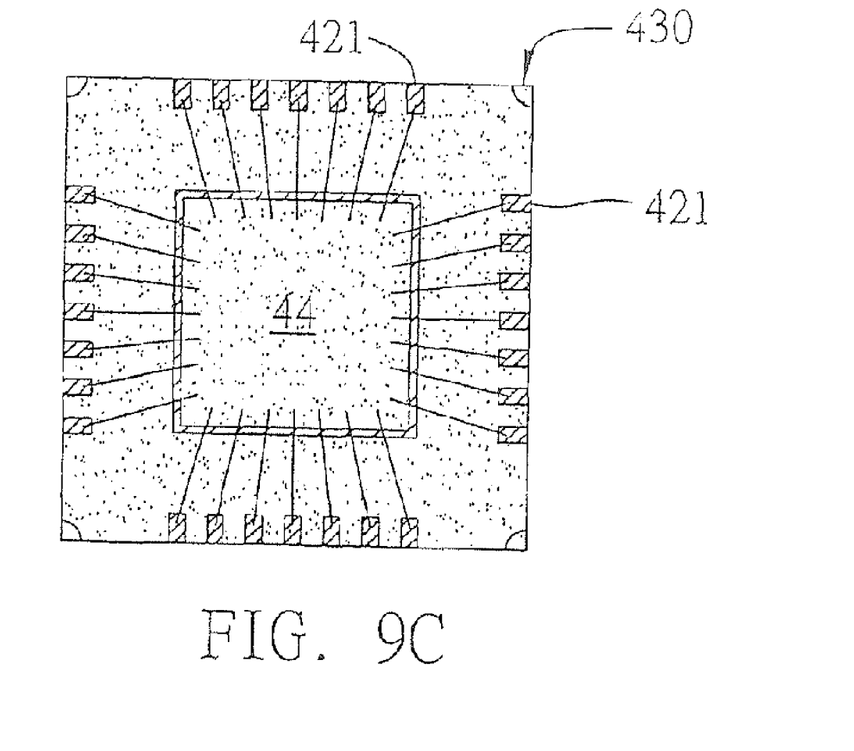
Figure 9D:
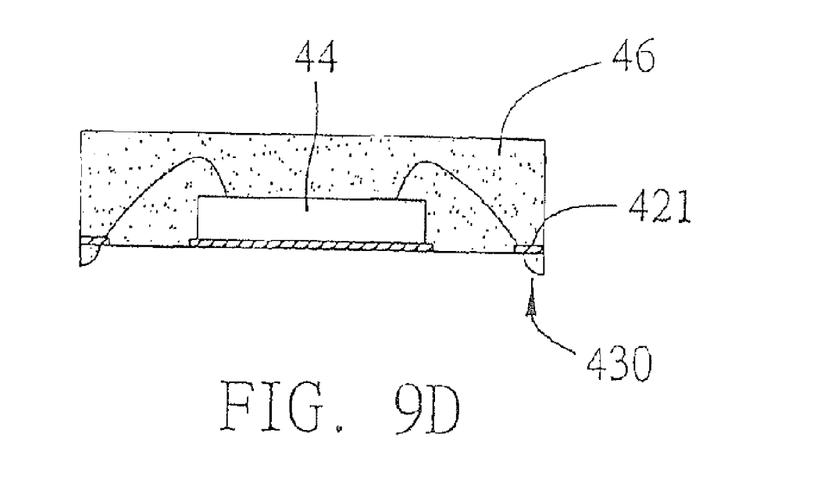

FIGS. 9A to 9D are schematic diagrams (including planar views and cross-sectional views) showing steps of a batch type method for massively fabricating semiconductor packages according to the present invention, so as to improve the throughput of the semiconductor packages and reduce the fabrication time and costs. As shown in FIGS. 9A and 9B, a metal carrier 40 is defined with a plurality of package units 400 that are separated by a plurality of transverse cutting lines Sx and longitudinal cutting lines Sy arranged in a matrix. When forming electrical contacts 421 and recessed portions 43 on the carrier 40, the electrical contacts 421 are formed on the carrier 40 at positions where the cutting lines Sx or Sy pass through, and the recessed portions 43 are formed on the carrier 40 at positions where the cutting lines Sx and Sy intersect. After mounting chips 44, electrically connecting the chips 44 to the electrical contacts 421 (by a wire-bonding method or a flip-chip method), and forming an encapsulant 46, the carrier 40 is removed, and a singulation process is performed to cut along the cutting lines Sx and Sy, such that the cutting passes through the electrical contacts 421 and outwardly protruded portions 430 formed on the encapsulant 46 corresponding in position to the recessed portions 43 of the carrier 40, so as to form the singulated package units 400 each having its own electrical contacts 421 and protruded portions 430 as shown in FIGS. 9C and 9D. By the batch type fabrication method, the semiconductor packages according to the present invention can be produced massively and quickly, thereby reducing the fabrication costs and time.

Figure 10A:
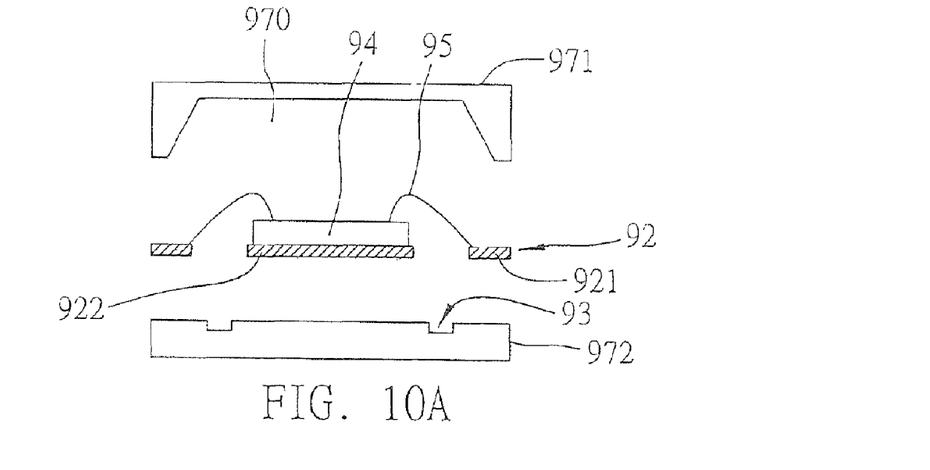
FIGS. 10A to 10C are cross-sectional views showing steps of a fabrication method of a semiconductor with a support structure according to a further preferred embodiment of the present invention.
Figure 10B:
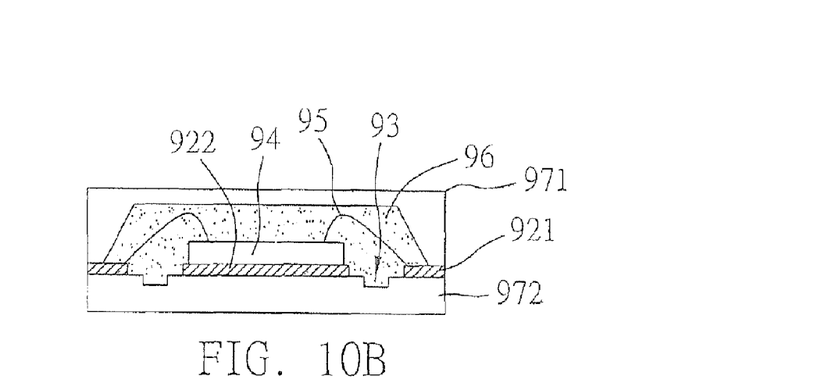
Figure 10C:
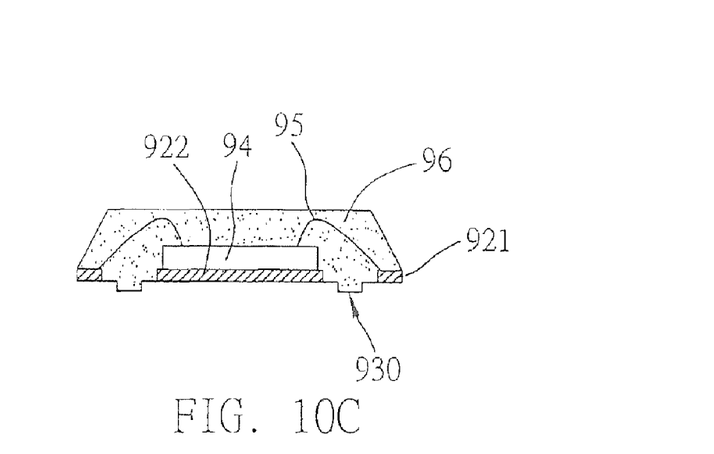

FIGS. 10A to 10C are cross-sectional views showing steps of the fabrication method of a semiconductor with a support structure according to a further preferred embodiment of the present invention. The present invention can be applied to not only the foregoing semiconductor package without a chip carrier, but also a general semiconductor package with a lead frame.

As shown in FIG. 10A, a lead frame 92 such as an QFN lead frame is prepared, which has a die pad 922 and a plurality of leads 921 formed around the die pad 922. A semiconductor chip 94 is mounted on the die pad 922 and is electrically connected to the leads 921 by bonding wires 95. The lead frame 92 mounted with the chip 94 is placed into a mold cavity 970 formed by an upper mold 91 and a lower mold 972 for a subsequent molding process, wherein a surface of the lower mold 972 is formed with recessed portions 93 at positions not interfering with the arrangement of the lead frame 92.

As shown in FIG. 10B, the molding process is carried out by injecting an encapsulant 96 into the mold cavity 970 to encapsulate the semiconductor chip 94 and the bonding wires 95 and fill the recessed portions 93 of the lower mold 972.

As shown in FIG. 10C, the upper mold 971 and the lower mold 972 are removed, such that bottom surfaces of the die pad 922 and the leads 921 are exposed from the encapsulant 96, and the part of the encapsulant 96 filling the recessed portions 93 forms outwardly protruded portions 930 on a surface of the encapsulant 96.

It should be noted that the above fabrication processes can be performed with a single package method or a batch type method that is for massively producing the required semiconductor packages. The protruded portions may have a shape such as a dot shape, strip shape or circular shape, etc. The number and location of the protruded portions are flexibly arranged according to practical design requirements to allow the semiconductor package to be effectively connected to an external device through the protruded portions.

Therefore, according to the semiconductor package with a support structure and the fabrication method thereof proposed in the present invention, after the chip is electrically connected to the electrical contacts of the semiconductor package, the molding process is performed, such that the encapsulant is injected to encapsulate the chip and fill the recessed portions formed on the carrier. After the carrier is removed, the part of the encapsulant filling the recessed portions forms the protruded portions on the surface of the encapsulant, and the semiconductor package can be attached to an external device via the protruded portions. This arrangement can avoid a short circuit problem resulted from mutual contact between solder materials applied on the adjacent electrical contacts of the semiconductor package if an attachment distance between the semiconductor package and the external device or an amount of the solder materials being used is not precisely controlled when the semiconductor package is directly attached to and abuts against the external device as in the prior art. Moreover, the protruded portions on the surface of the encapsulant have a supporting height to support the semiconductor package, such that excessively high thermal stress and solder joint cracks caused by an excessively low height of solder material between the semiconductor package and the external device can be eliminated.

The present invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package with a support structure, the semiconductor package comprising:
   a plurality of electrical contacts;
   at least one chip electrically connected to the electrical contacts; and
   an encapsulant for encapsulating the chip and the electrical contacts, wherein at least one surface of each of the electrical contacts is exposed from the encapsulant, and outwardly protruded portions are formed on a surface of the encapsulant and between the electrical contacts so as to allow the semiconductor package to be attached to an external device via the protruded portions, and wherein the semiconductor package is free of having a lead frame and the protruded portions are formed with a shape of dot shape.

2. The semiconductor package of claim 1, wherein the chip is electrically connected to the electrical contacts by one of a flip-chip method and a wire-bonding method.

3. The semiconductor package of claim 1, wherein the protruded portions of the encapsulant are formed in the semiconductor package at positions free of interference with the electrical contacts and the chip.

4. The semiconductor package of claim 1, further comprising a die pad for mounting the chip thereon.

\* \* \* \* \*